March 26, 1968 R. WIESNER 3,375,146

METHOD FOR PRODUCING A P-N JUNCTION IN A MONOCRYSTALLINE SEMICONDUCTOR MEMBER BY ETCHING AND DIFFUSION

Filed July 16, 1964

3,375,146
METHOD FOR PRODUCING A P-N JUNCTION IN A MONOCRYSTALLINE SEMICONDUCTOR MEMBER BY ETCHING AND DIFFUSION

Richard Wiesner, Munich, Germany, assignor to Siemens Aktiengesellschaft, a corporation of Germany
Filed July 16, 1964, Ser. No. 383,040
Claims priority, application Germany, July 23, 1963, S 86,327
2 Claims. (Cl. 148—186)

Figure 1:
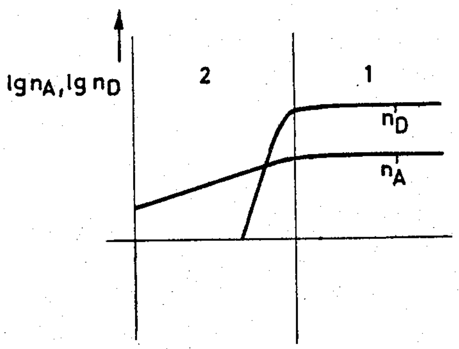

My invention relates to a method for producing a p-n junction in a monocrystalline semiconductor member.

My copending application Ser. No. 193,270 of May 8, 1962, now Patent No. 3,260,624, describes a method of producing a p-n junction in a monocrystalline semiconductor member in which a substrate of a semiconductor body is doped with donors and acceptors of respectively different diffusion constants, the dopant having the lower diffusion coefficient being preponderant. Both dopants diffuse simultaneously into a subsequently grown adjacent region and form a p-n junction in this adjacent region. More specifically, according to the method of the copending application, a monocrystalline layer of semiconductor substance is pyrolytically precipitated from a gaseous semiconductor compound upon a monocrystalline substrate of semiconductor material highly doped with donors and acceptors. The substrate serves as a heat source for dissociating the gaseous compound. After precipitating the semiconductor substance upon the surface of the substrate, the resulting semiconductor body is heated an additional period of time until one of the two dopants, which diffuses during the tempering treatment from the substrate into the grown layer, produces the desired type of conductance only at the side of the grown layer furthest removed from the substrate, whereas the other dopant has virtually not yet reached a large portion of the grown layer.

By this method, I am able to produce in a semiconductor layer epitaxially grown on a substrate of a corresponding crystalline structure, a dopant concentration such that the conductivity increases from smaller values in the direction toward the substrate. This kind of doping is desirable, for example, for the base region of transistors whose field of application demands a lowest possible emitter capacitance.

It is an object of the present invention to improve my above-mentioned process by limiting the course of dopant concentration in the epitaxially grown layer to certain areas so that a limited space is obtained, for example of the type known from the conventional planar transistors.

Such semiconductor members are favorably produced in accordance with the method of the present invention as follows: A p-n junction is produced in a monocrystalline semiconductor member by providing a region of the semiconductor member with donors and acceptors of respectively different diffusion coefficients in which the dopant having the lower diffusion coefficient is preponderant. Both dopants are simultaneously diffused into an adjacent region so as to form a p-n junction. This is accomplished by employing a semiconductor substrate highly doped with donors and acceptors and depositing thereupon a monocrystalline semiconductor layer by thermal-chemical (pyrolytic) dissociation of a gaseous semiconductor compound on the surface of the substrate which serves as a source of heat for the dissociation. After termination of the precipitation, the resulting semiconductor body is tempered until the dopants diffusing from the substrate into the grown layer produce the desired conductivity substantially only at the side of the grown layer facing away from the substrate, whereas the other dopant has virtually not yet reached a large portion of the grown layer. My invention adds the improvement that only a limited zone of the substrate is thus provided with donors as well as with acceptors, and the surface of the monocrystalline semiconductor layer grown upon the substrate is coated with an oxide layer before or during the diffusion process.

This improvement is achieved by providing a substrate having a given conductance type with dopant substance of the opposite conductance type, but limiting the dopant to confined areas and then diffusing the dopant into the semiconductor body. The method can also be performed by providing a doping material which simultaneously contains donors and acceptors in corresponding concentrations, placing the material upon limited areas of the semiconductor body, and then diffusing the dopant into the semiconductor body.

According to another feature of the invention, the deposition of the dopant materials upon limited surface areas is effected by vapor-deposition through a mask or stencil, or by diffusion while employing an oxide masking.

According to another mode of performing the method of the invention, the limitation of the doped regions is effected by providing the entire surface of the semiconductor body with the dopant materials and diffusing them into the surface, and thereafter eliminating the doping materials by etching at the localities where no such doping is to be present. The doping substances are then diffused into the semiconductor body by subsequent diffusion.

In order to obtain a smooth substrate surface before commencing the epitaxial growth, it is preferable to make certain that the substrate surface provided with donors and acceptors is planar before beginning the growing process. This can be done by mechanical means such as lapping or polishing and/or by chemical means such as etching.

Figure 2:
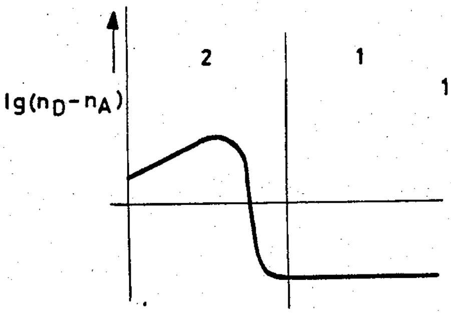
Figure 3:
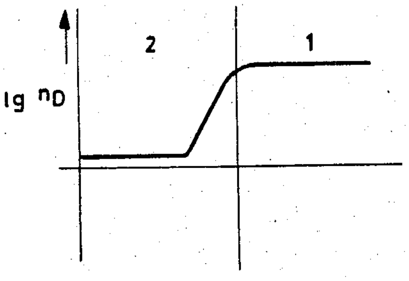
Figure 4:
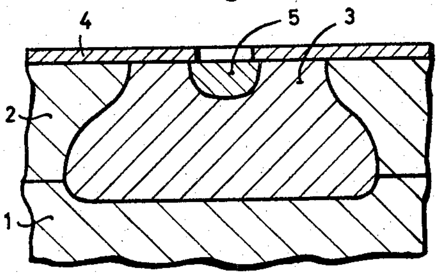

The invention will be further described with reference to embodiments illustrated by way of example on the accompanying drawing in which:

FIGS. 1, 2 and 3 are explanatory graphs;

FIG. 4 describes the spacial dopant concentration; and

FIGS. 5 through 8 schematically show the process omitting the oxide masking.

The same items in all illustrations are denoted by the same reference characters respectively.

The diagrams shown in FIGS. 1 and 2 indicate the course of the concentration on a logarthmic scale, with respect to the acceptors $n_A$ and the donors $n_D$ in the regions that are provided with "double" doping within a semiconductor substrate 1 and an epitaxially grown layer 2.

In the particular embodiment represented, the substrate 1 consists of silicon with a donor concentration of $10^{20}$ atoms/cc. phosphorus. With the aid of a mask, aluminum is vaporized onto limited surface areas of the substrate 1, these areas having for example the dimensions of a desired base area on a transistor. The vaporized aluminum is then alloyed into the silicon body so that in these regions there is produced a doping with an acceptor concentration of $10^{19}$ atoms/cc. down to a depth of 10 to 30 $\mu$m. Thereafter, an epitaxial layer weakly doped with donor substance is deposited with a thickness of 5 to 10$\mu$ dependent upon the flow rate of the reaction gas consisting of, for example, $SiCl_4$ or $SiHCl_3$ diluted with $H_2$ and dopant, and is a maximum of 0.5–1$\mu$/min. The precipitation temperature is in the range of 1050 to 1150° C. at which temperature the diffusion constant (coefficient) of phosphorus in silicon is $10^{-12}$ cm.$^2$/sec. and of aluminum in silicon is $5\times10^{-12}$ cm.$^2$/sec. Thereafter tempering is performed at 1100° C. for 75 minutes. The surface of the epitaxially grown layer 2 is thereafter oxidized. The dopant distribution then corresponds in the regions of "double" doping to the curves shown in FIGS. 1 and 2.

In the regions outside of double doping, the course of the donor concentration in the semiconductor substrate 1 and in the epitaxial layer 2 corresponds to the curves shown in FIG. 3.

FIG. 4 exemplifies schematically the spacial dopant distribution in a semiconductor body produced in the above-described manner.

A substrate 1 of silicon doped for n-type conductance is provided with an n-doped layer 2 of the same material which is epitaxially grown upon the substrate 1. In the layer 2, a limited region 3, for example the base region of a transistor, is provided with p-dopant. In the present example, this is done by placing boron upon a limited surface area of the substrate 1, using an oxide mask. The boron has the desired concentration, for example $10^{19}$ atoms/cc. The boron is then diffused into the silicon body. After removing the oxide mask, the layer 2 is epitaxially grown. After terminating the growing process, the epitaxial layer 2 is provided with an oxide coating 4. The semiconductor body is then subjected to tempering. This effects diffusion of the dopant substances in the substrate 1 and in the epitaxial layer 2, which results in the desired course of the dopant concentration in these regions. In the embodiment of FIG. 4, the method was repeated in order to produce an emitter region 5 by diffusion.

The method is analogously applicable to the production of germanium transistors. In this case it is preferable to employ acceptors as fundamental dopant and donors as partial dopants. The sequence of the layers is then inverse to the one illustrated in FIG. 4.

Figure 5:
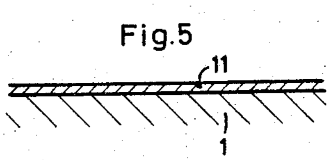

If the method is to be simplified by omitting the oxide masking for the localized position of the dopant substances, then the procedure schematically illustrated in FIGS. 5 to 8 may be followed. First, as shown in FIG. 5, the entire surface of the substrate 1 is charged with dopant substances 11. In the present case, a substrate of n-doped silicon was used. The substrate was charged with acceptors, for example boron or aluminum.

Figure 6:
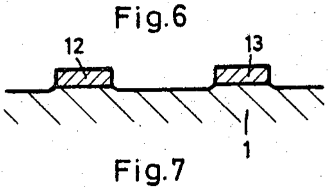

In a second method step, the dopant-charged surface is eliminated by etching with the exception of the regions 12 and 13 according to FIG. 6.

Figure 7:
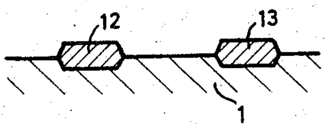

During the subsequent tempering, the dopant substances diffuse into the surface of the substrate 1 and thus form the doped regions 12 and 13 as indicated in FIG. 7.

Figure 8:
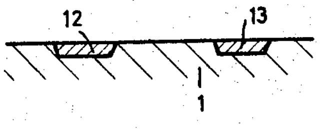

It is advisable to thereafter render the surface of the substrate 1 planar by mechanical or chemical means, this being illustrated in FIG. 8.

The method is suitable not only for producing transistors but also diodes, particularly varactor diodes and other semiconductor devices.

I claim:

1. The method for producing a p-n junction in a monocrystalline semiconductor member, which comprises placing upon the surface of a semiconductor of a given conductance type, a dopant material of opposite conductance type, etching the dopant from areas not to be doped, diffusing the remaining dopant into the semiconductor body; precipitating a monocrystalline silicon layer of from 5 to 10 μm thick upon the monocrystalline substrate at a temperature from 1050° to 1150° C. by pyrolytic dissociation of a gaseous semiconductor compound at the surface of the heated substrate; and after termination of the growing process tempering the resulting semiconductor body at 1100° C. for about 75 minutes whereby only one dopant diffused from the substrate into the grown layer produces the desired type of conductance at the layer side facing away from the substrate, whereas the other dopant has virtually not yet reached a large portion of the grown layer.

2. The method for producing a p-n junction in a monocrystalline semiconductor member, which comprises placing upon the surface of a semiconductor of a given conductance type, a dopant material of opposite conductance type, etching the dopant from areas not to be doped, diffusing the remaining dopant into the semiconductor body; making the surface planar; precipitating a monocrystalline silicon layer upon the monocrystalline substrate at from 1050° C. to 1150° C. by pyrolytic dissociation of a gaseous semiconductor compound at the surface of the heated substrate; and after termination of the growing process tempering the resulting semiconductor body at about 1100° C. until only one dopant diffused from the substrate into the grown layer produces the desired type of conductance at the layer side facing away from the substrate, whereas the other dopant has virtually not yet reached a large portion of the grown layer.

References Cited

UNITED STATES PATENTS

| | | | |
|---|---|---|---|
| 3,085,033 | 4/1963 | Handelman | 148—191 |
| 3,149,395 | 9/1964 | Bray | 148—175 X |
| 3,156,591 | 11/1964 | Hale | 148—175 |
| 3,194,969 | 7/1965 | White | 148—175 X |
| 3,215,570 | 11/1965 | Andrews | 148—188 |
| 3,243,323 | 3/1966 | Corrigan | 148—175 |
| 3,260,624 | 7/1966 | Wiesner | 148—175 |

HYLAND BIZOT, *Primary Examiner.*